(12) United States Patent
Kuo et al.

(10) Patent No.: US 6,183,916 B1
(45) Date of Patent: Feb. 6, 2001

(54) METHOD FOR PROXIMITY EFFECT COMPENSATION ON ALTERNATIVE PHASE-SHIFT MASKS WITH BIAS AND OPTICAL PROXIMITY CORRECTION

(75) Inventors: Chen-Cheng Kuo, Chu-pei; Hua-Tai Lin, Yu-kang; Chia-Hui Lin, Hsin-Chu, all of (TW)

(73) Assignee: Taiwan Semiconductor Manufacturing Company, Hsin-Chu (TW)

(*) Notice: Under 35 U.S.C. 154(b), the term of this patent shall be extended for 0 days.

(21) Appl. No.: 09/395,283

(22) Filed: Sep. 13, 1999

(51) Int. Cl.$^7$ ................. G03F 9/00; G06F 3/00
(52) U.S. Cl. ........................... 430/5; 395/500.21
(58) Field of Search .................. 430/5, 322; 395/500.2, 395/500.21

(56) References Cited

U.S. PATENT DOCUMENTS 5,682,323   10/1997   Pasch et al. .................. 364/491
5,858,591   1/1999    Lin et al. ..................... 430/30

*Primary Examiner*—S. Rosasco
(74) *Attorney, Agent, or Firm*—George O. Saile; Stephen B. Ackerman; Larry J. Prescott

(57) ABSTRACT

A method of forming an alternative phase shifting mask and forming a circuit pattern on a wafer using the mask are described. Optical proximity correction is added to a data file, in which a description of a circuit pattern has been stored, to obtain a first modified data file. The first modified data file is then separated into a second modified data file, for regions of the mask having dense line/space patterns, and a third modified data file, for regions of the mask having isolated line space patterns. Critical dimension bias is then added to the second modified data file forming a fourth modified data file. The third modified data file and the fourth modified data file are then merged into a single fifth modified data file. The fifth modified data file is then is then converted to an alternative phase shift data file. An alternative phase shift mask is then formed from the alternative phase shift data file. The alternative phase shift mask has then been corrected for optical proximity effect and critical dimension bias has been added. This alternative phase shift mask can then be used in forming the circuit pattern on an integrated circuit wafer.

17 Claims, 7 Drawing Sheets

6,183,916 B1

METHOD FOR PROXIMITY EFFECT COMPENSATION ON ALTERNATIVE PHASE-SHIFT MASKS WITH BIAS AND OPTICAL PROXIMITY CORRECTION

BACKGROUND OF THE INVENTION (1) Field of the Invention

This invention relates to phase shifting masks used to form photolithographic images on wafers and more particularly to mask corrections to compensate for image distortion.

(2) Description of the Related Art

Photolithography is critical to the fabrication of integrated circuit wafers and utilizes masks to transfer images, such as line/space patterns, to the wafer. As circuit densities increase critical dimensions decrease and line/space patterns become more and more dense. FIG. 1 shows an example of a part of a dense line/space pattern on a wafer with a number of lines 20 having a first linewidth 22 on a first pitch 24. FIG. 2 shows an example of a part of an isolated line/space pattern with lines 21 having a second linewidth 23, greater than the first linewidth 22, on a second pitch 25, greater than the first pitch 24. Frequently both dense line/space patterns and isolated line/space patterns are part of the same circuit pattern formed on a wafer.

FIG. 3 shows a part of a binary mask, often used in the formation of the patterns on a wafer, having opaque lines 32 formed on a transparent mask wafer 30. FIG. 4 shows an alternative phase shifting mask, sometimes referred to as a Levenson phase shifting mask, used as an alternative to a conventional binary mask for forming line/space patterns. The alternative phase shifting mask has lines 34 formed of phase shifting material on a transparent mask substrate 30.

In forming photolithographic patterns exposure latitude and depth of focus are important parameters. As the line/space patterns become more dense optical distortion becomes a problem in the pattern formation. Optical proximity effect is a form of optical distortion associated with the formation of photolithographic images. Diffraction effects occurring on both sides of a sharp pattern edge become important as the critical dimensions of pattern features decreases. The use of alternative phase shifting masks in place of binary masks improves the exposure latitude and depth of focus but the problem of proximity effect increases.

U.S. Pat. No. 5,858,591 to Lin et al. describes a method of correcting for optical distortion during wafer processing by modification of subfiles used to form the masks. The subfiles are modified to correct for optical proximity effect and to add or subtract a suitable bias to the subfiles.

U.S. Pat. No. 5,682,323 to Pasch et al. describes a system and method of performing optical proximity correction on an integrated circuit by performing optical proximity correction on a library of cells.

SUMMARY OF THE INVENTION

It is a principal objective of this invention to provide a method of forming phase shifting masks which provide correction for optical proximity effect and add critical dimension bias.

It is another principal objective of this invention to provide a method of forming circuit patterns on a wafer using phase shifting masks which provide correction for optical proximity effect and add critical dimension bias.

These objectives are achieved by beginning with a data file used to form a traditional binary mask for a circuit pattern. Optical proximity correction is then added to the file to obtain a first modified data file. The first modified data file is then separated into a second modified data file, for regions of the mask having dense line/space patterns, and a third modified data file, for regions of the mask having isolated line space patterns. Critical dimension bias is then added to the second modified data file forming a fourth modified data file.

The third modified data file and the fourth modified data file are then merged into a single fifth modified data file. The fifth modified data file could be used to form a binary mask having optical proximity correction and critical dimension bias. The fifth modified data file is then converted to an alternative phase shift data file. An alternative phase shift mask is then formed from the alternative phase shift data file. The alternative phase shift mask has been corrected for optical proximity effect and critical dimension bias has been added. This alternative phase shift mask can then be used in forming the circuit pattern on an integrated circuit wafer.

DESCRIPTION OF THE PREFERRED EMBODIMENTS

Figure 1:
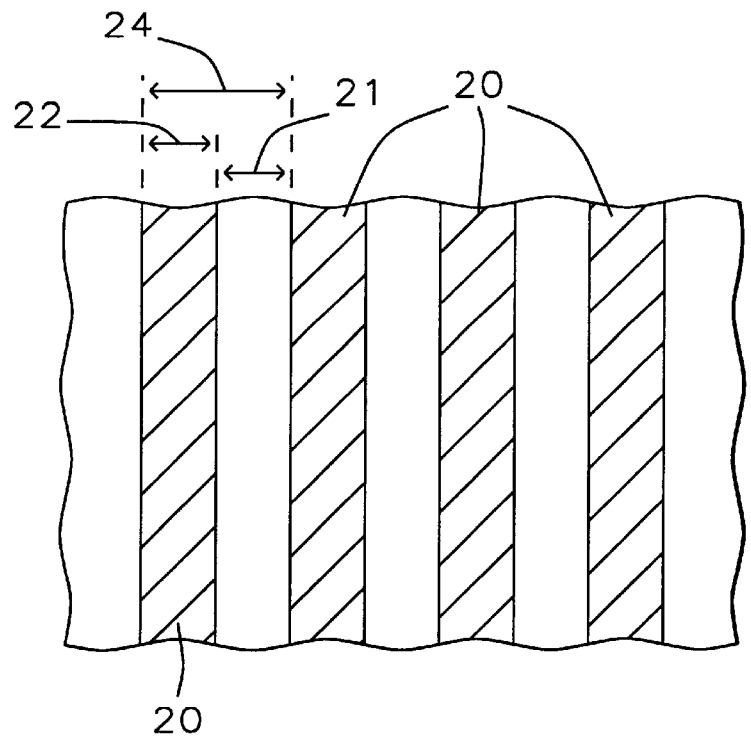
FIG. 1 shows a top view of a part of a wafer showing a dense line/space pattern.

Refer now to FIGS. 1–10 for a description of the methods of this invention for forming an alternative phase shifting mask and for forming a circuit pattern on a wafer. FIG. 1 shows a part of a wafer showing a line/space pattern having a number of lines 20 with a linewidth 22. The lines 20 are repeated on a pitch 24 and the ratio of the linewidth 22 to the pitch 24 will hereinafter be referred to as the duty ratio. Line/space patterns having equal linewidths 22 and spaces 21 have a duty ratio of 1:2 and form dense line/space patterns. Line/space patterns having duty ratios of 1:X where X is 2, 3, 4, or greater form more isolated line/space patterns.

Figure 2:
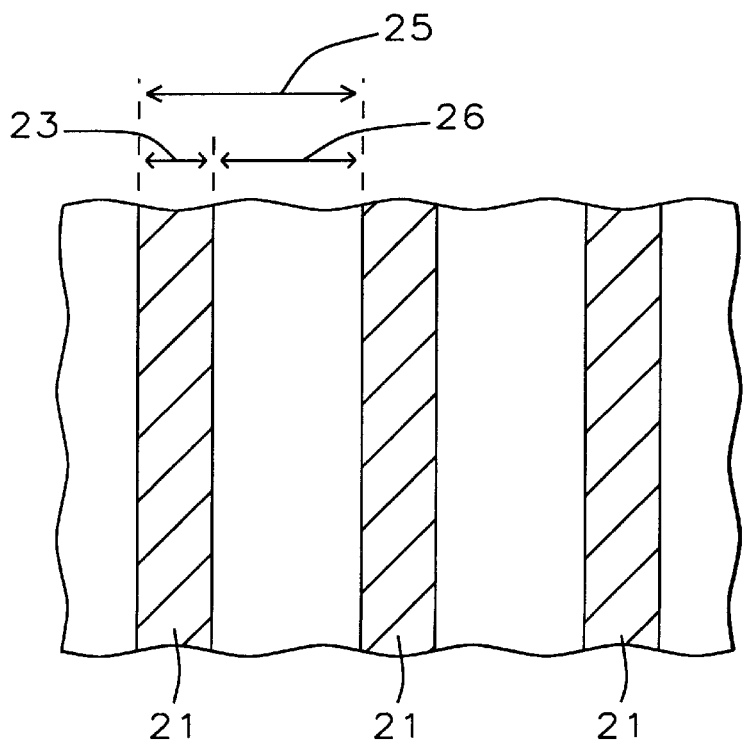
FIG. 2 shows a top view of a part of a wafer showing an isolated line/space pattern.

FIG. 1 shows a dense line/space pattern with a duty ratio of about 1:2. FIG. 2 shows a more isolated line/space pattern showing lines 21 having a linewidth 23 on a pitch 25 where the space 26 between the lines 21 is at least two linewidths 23. The patterns shown in FIG. 2 have a duty ratio, the ratio of the linewidth 23 to the pitch 25, of 1:X where X is 3 or larger.

Figure 3:
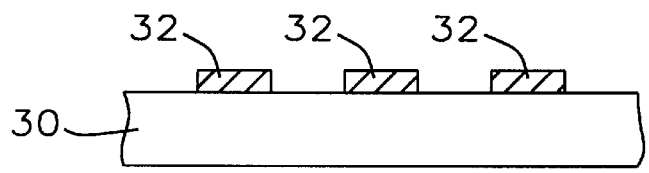
FIG. 3 shows a cross section view of a part of a binary mask.
Figure 4:
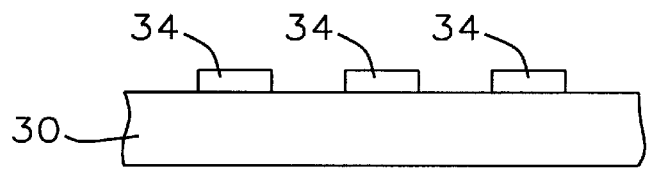
FIG. 4 shows a cross section view of a part of an alternative phase shifting mask.

FIG. 3 shows a cross section of a part of a binary mask used to form line space patterns showing opaque lines 32, formed of a material such as chrome or the like, formed on a transparent mask substrate 30, such as quartz. FIG. 4 shows a cross section of a part of an alternative phase shift mask, or Levenson phase shift mask, having transparent phase shifting lines 34, formed of a material such as silicon dioxide or quartz, formed on a transparent mask substrate 30, such as quartz. As the linewidths become very small, for example about 0.16 microns, problems arise when photolithography is used to form the patterns on a wafer. exposure latitude and depth of focus are very important in photolithography and the alternative phase shifting mask provides improved exposure latitude and depth of focus making it a desirable alternative over the binary mask for the line/space patterns. However, the problem of optical proximity effect is more severe with the alternative phase shift mask. In addition for dense line/space patterns the use of a critical dimension bias is necessary.

Optical proximity effect is a form of optical distortion associated with photoresist images. Image features whose size approach the resolution limit of the radiation used to illuminate the mask are subject to distortion that depends on how the diffraction maxima and minima that lie on both sides of a sharp edge interact with each other.

Optical proximity effect can be compensated for, at least in part, by modifying any given feature in the opposite direction to the expected distortion. The optical proximity correction, OPC, is commonly calculated by summing two Gaussian functions whose value depend on a critical dimension, CD, defined by the design rules as well as the wave-length of the exposing radiation. In general, the distortion of lines that are part of a dense pattern will be greater than the distortion of more isolated lines. The optical proximity correction is calculated for a particular pattern and added to the mask data for that pattern. In addition a critical dimension bias can be added to the features in the dense part of the pattern.

FIGS. 5–8 show the effect of adding critical dimension bias on pattern features formed with alternative phase shift masks. FIGS. 5–8 show curves of feature size as a function of defocus for lines having duty ratios of 1:2, 1:3, 1:4, and 1:5 for 0.16 micron linewidth. The critical dimension of 0.13 microns is indicated by a solid line 10. The +/−10% tolerance band around the critical dimension is indicated by dashed lines, 12 and 14. In FIGS. 5–8 the 0.16 micron isolated lines; having duty ratios of 1:3, 1:4, and 1:5; are overexposed to 0.13 micron on the wafer. In FIGS. 5–8 the curve representing lines having a duty ratio of 1:3 has reference number 103, the curve representing lines having a duty ratio of 1:4 has reference number 104, and the curve representing lines having a duty ratio of 1:5 has reference number 105.

Figure 5:
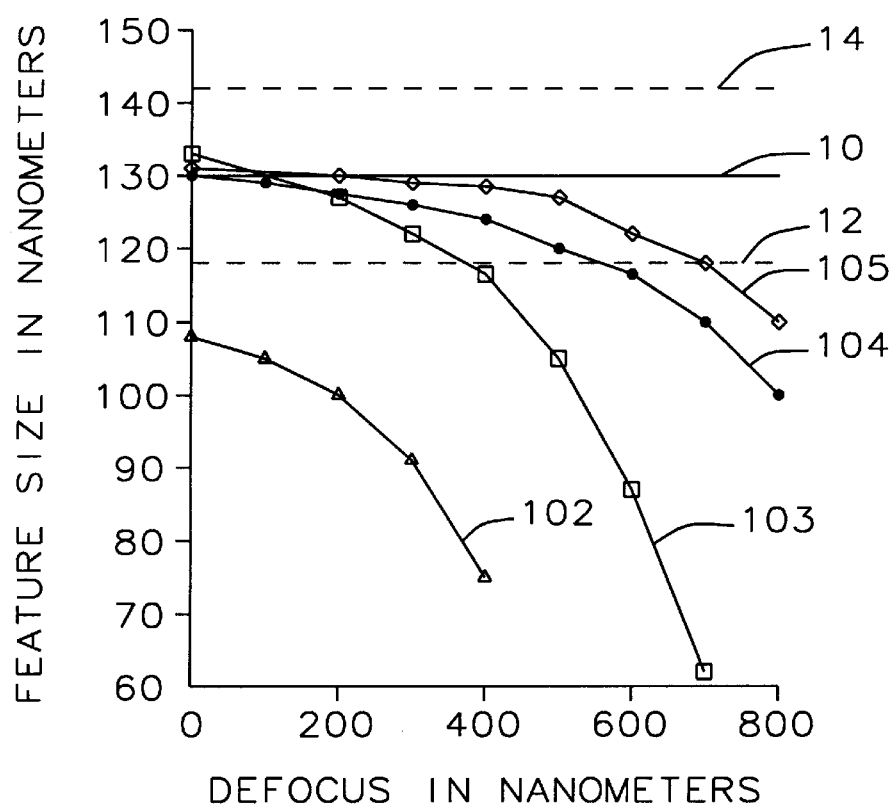
FIG. 5 shows curves of feature size as a function of defocus for lines having duty ratios of 1:2, 1:3, 1:4, and 1:5 for 0.16 micron linewidth when the 0.16 micron isolated line is overexposed to 0.13 micron on the wafer and the dense line, 1:2 duty ratio, critical dimension is left unchanged at 0.16 micron.
Figure 6:
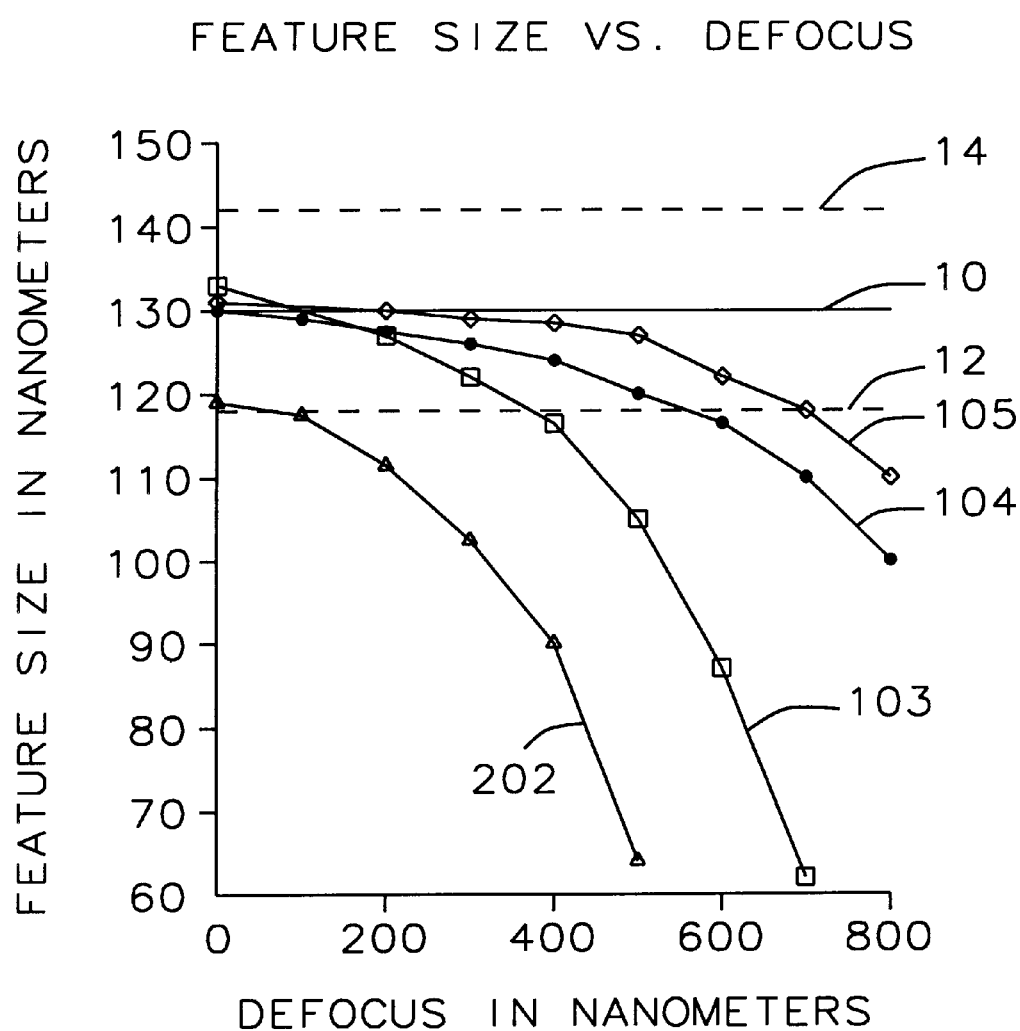
FIG. 6 shows curves of feature size as a function of defocus for lines having duty ratios of 1:2, 1:3, 1:4, and 1:5 for 0.16 micron linewidth when the 0.16 micron isolated line is overexposed to 0.13 micron on the wafer and the dense line, 1:2 duty ratio, critical dimension is increased to 0.18 micron.
Figure 7:
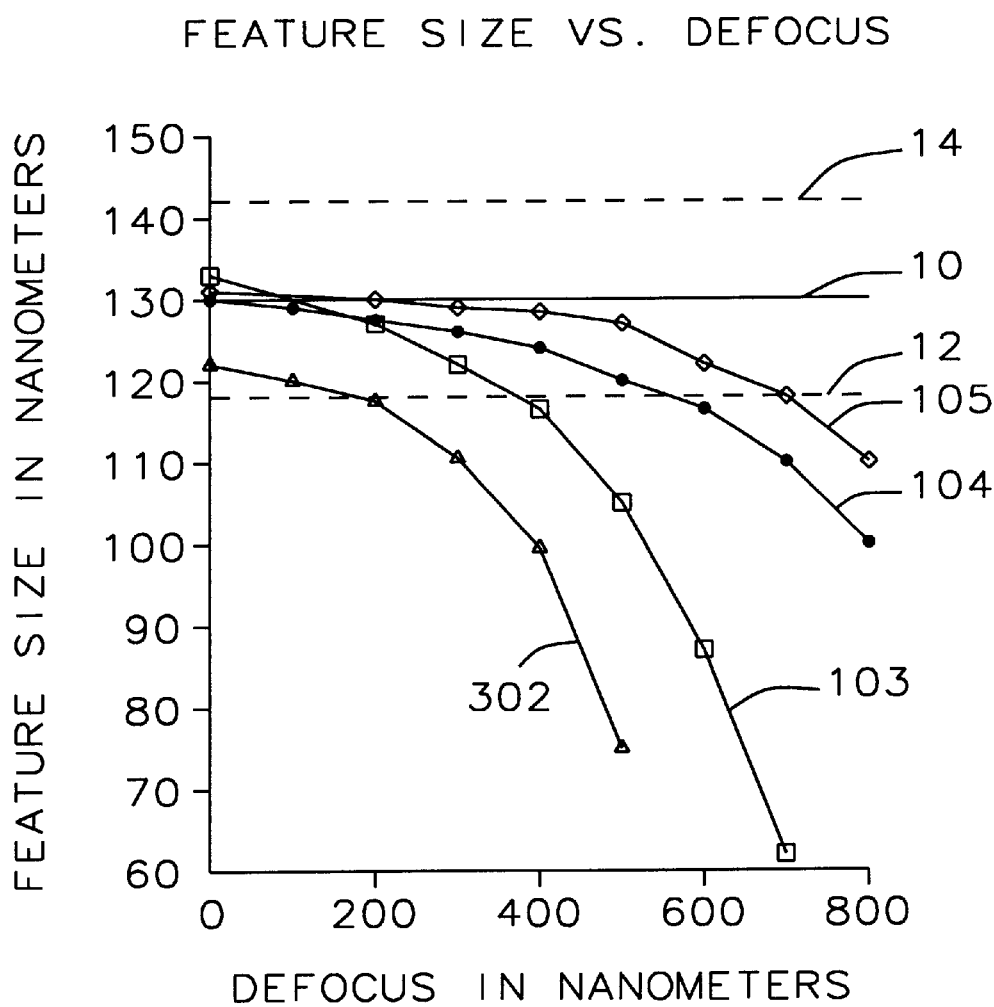
FIG. 7 shows curves of feature size as a function of defocus for lines having duty ratios of 1:2, 1:3, 1:4, and 1:5 for 0.16 micron linewidth when the 0.16 micron isolated line is overexposed to 0.13 micron on the wafer and the dense line, 1:2 duty ratio, critical dimension is increased to 0.20 micron.
Figure 8:
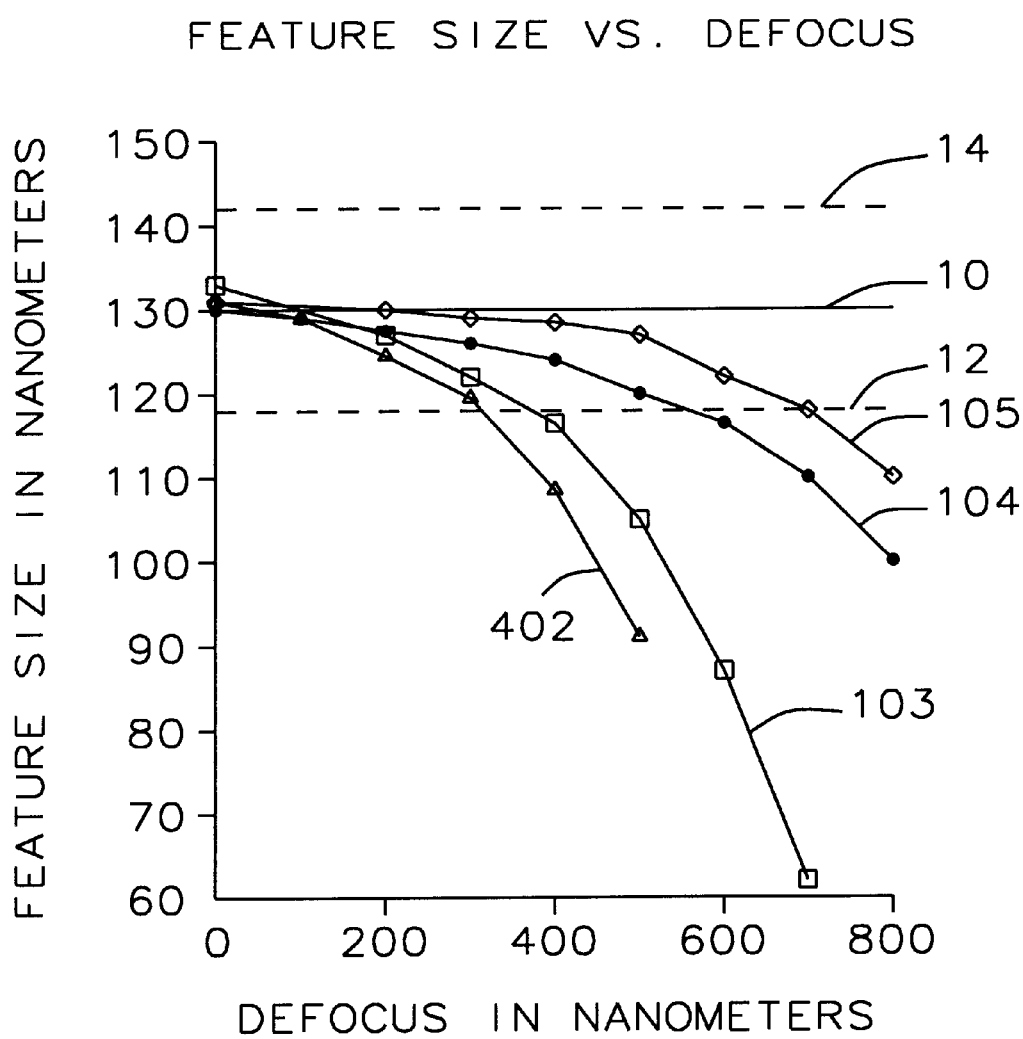
FIG. 8 shows curves of feature size as a function of defocus for lines having duty ratios of 1:2, 1:3, 1:4, and 1:5 for 0.16 micron linewidth when the 0.16 micron isolated line is overexposed to 0.13 micron on the wafer and the dense line, 1:2 duty ratio, critical dimension is increased to 0.22 micron.

FIG. 5 shows the curve representing dense lines 102, having a duty ratio of 1:2, having the same linewidth of 0.16 microns as the isolated lines. As shown in FIG. 5 the dense lines are outside the +/−10% over the entire defocus range. FIG. 6 shows the curve representing dense lines 202, having a duty ratio of 1:2, with a critical dimension bias of 0.02 microns added to the dense lines giving them a linewidth of 0.18 microns. FIG. 7 shows the curve representing dense lines 302, having a duty ratio of 1:2, with a critical dimension bias of 0.04 microns added to the dense lines giving them a linewidth of 0.20 microns. FIG. 8 shows the curve representing dense lines 402, having a duty ratio of 1:2, with a critical dimension bias of 0.06 microns added to the dense lines giving them a linewidth of 0.22 microns. As shown in FIG. 8, with the addition of a critical dimension bias of 0.06 microns the dense lines are within the +/−10% tolerance band until the defocus distance is 0.327 microns thereby increasing the depth of focus to 0.64 microns. FIGS. 5–8 show the advantage of adding critical dimension bias to that part of a phase shifting mask used to form the dense lines. In this example, for forming lines of between about 0.12 and 0.14 microns a critical dimension bias of between about 0.04 and 0.08 microns is used.

Figure 9:
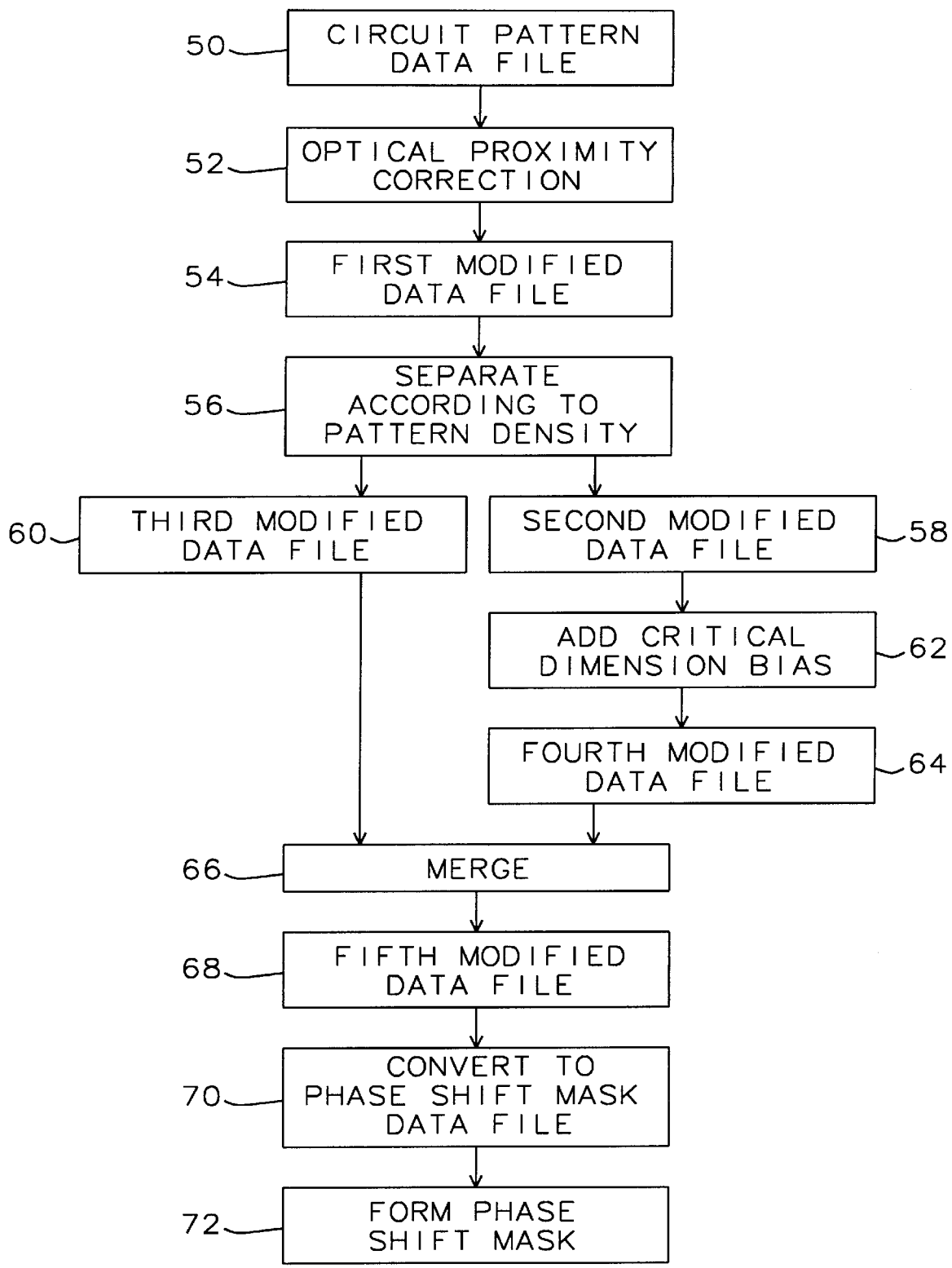
FIG. 9 shows a block diagram flow chart for the method of forming an alternative phase shift mask of this invention.

The methods of this invention will now be described with reference to FIGS. 9 and 10. FIG. 9 shows a flow diagram of the method of forming an alternative phase shift mask of this invention. As shown in the first box 50 in FIG. 9 a description of the circuit pattern to be incorporated in the mask is stored in a data file. This circuit pattern has dense line/space regions, with a duty ratio of 1:2 and isolated line/space regions, with a duty ratio of 1:X where X is 3 or more. A binary mask could be formed using the circuit pattern data stored in the data file at this stage.

As indicated in the next box 52 in FIG. 9, Optical Proximity Correction is applied to the data in the data file producing a first modified data file, box 54 in FIG. 9. The data in the first modified data file is then separated into a second modified data file, box 58 in FIG. 9, and a third modified data file, box 60 in FIG. 9. The second modified data file contains the data related to the dense line region of the pattern and the third modified data file contains data related to the isolated line region of the pattern.

As shown in box 62 of FIG. 9, critical dimension bias is added to the data in the second modified data file producing a fourth modified data file, box 64 of FIG. 9. As indicated by box 66 of FIG. 9, the fourth modified data file and the third modified data file are merged into a fifth modified data file, box 68 in FIG. 9. The data in the fifth modified data file could be used to form a binary mask, however a phase shifting mask is desired. As shown in box 70 of FIG. 9, the fifth modified data file is converted to a phase shifting mask data file. As shown in box 72 of FIG. 9, the data in the phase shifting mask data file is then used to form a phase shifting mask.

Figure 10:
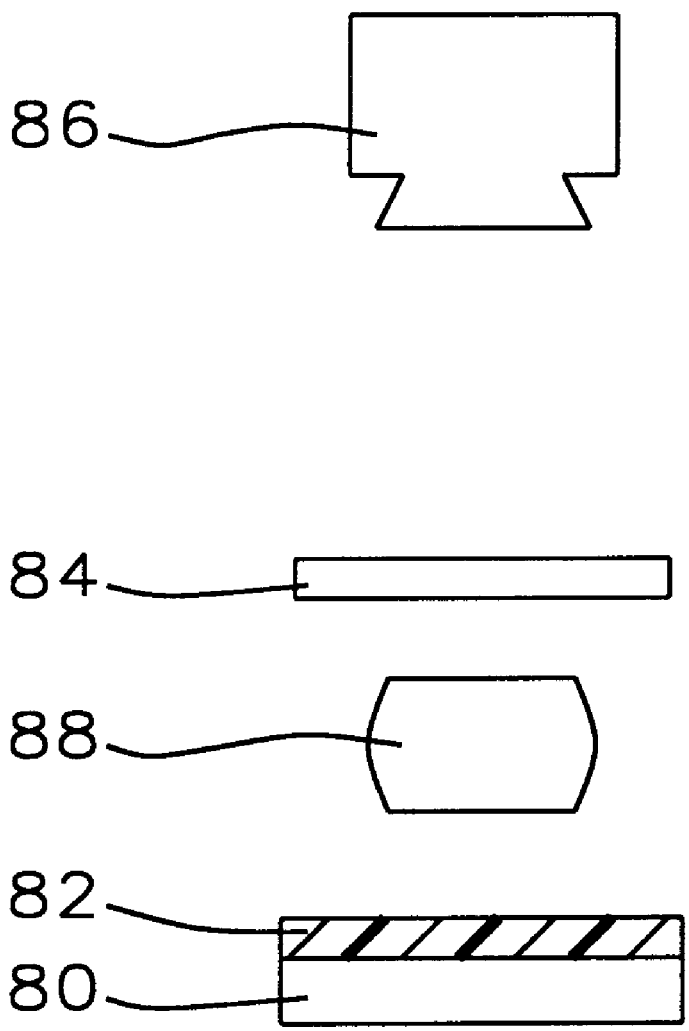
FIG. 10 shows a schematic diagram of a projection exposure system for forming patterns on a wafer using the alternative phase shift mask of this invention.

FIG. 10 shows a schematic view of a projection exposure system used to form a circuit pattern on a wafer according to the method of this invention. First the circuit pattern is formed in a mask according to the block diagram of FIG. 9 and described in the preceding embodiment. As shown in FIG. 10, a layer of photosensitive insulating material 82, such as photoresist, is formed on a wafer 80. A light source 86 illuminates the mask 84 and an objective lens 88 forms the image of the mask on the layer of photosensitive insulating material 82. The light source in this example has a wavelength of either 365 or 248 nanometers.

While the invention has been particularly shown and described with reference to the preferred embodiments thereof, it will be understood by those skilled in the art that various changes in form and details may be made without departing from the spirit and scope of the invention.

What is claimed is:

1. A method of forming phase shifting masks, comprising:

storing a description of a circuit pattern in a data file, wherein said circuit pattern has dense line/space regions, having lines with a first linewidth on a first pitch, and isolated line/space regions, having lines with a second linewidth on a second pitch;

applying an Optical Proximity Correction to said data file thereby forming a first modified data file;

separating said first modified data file into a second modified data file and a third modified data file, wherein said second modified data file contains data relating to said dense line/space regions and said third modified data file contains data relating to said isolated line/space regions;

adding a critical dimension bias to said second modified data file thereby forming a fourth modified data file;

merging said third modified data file and said fourth modified data file into a fifth data file;

converting said fifth data file into a phase shifting mask data file; and forming a phase shifting mask using said phase shifting mask data file.

2. The method of claim 1 wherein said phase shifting mask is an alternative phase shifting mask.

3. The method of claim 1 wherein the ratio of said first pitch to said first linewidth is about two.

4. The method of claim 1 wherein the ratio of said second pitch to said second linewidth is equal to or greater than about three.

5. The method of claim 1 wherein said first linewidth is between about 0.12 and 0.14 microns.

6. The method of claim 1 wherein said critical dimension bias is between about 0.04 and 0.08 microns.

7. The method of claim 1 wherein said phase shifting mask is to be used with light having a wavelength of 365 nanometers or 248 nanometers to form said circuit pattern on an integrated circuit wafer.

8. A method of forming circuit patterns, comprising:

providing a wafer;

storing a description of a circuit pattern in a data file, wherein said circuit pattern has dense line/space regions, having lines with a first linewidth on a first pitch, and isolated line/space regions, having lines with a second linewidth on a second pitch;

applying an Optical Proximity Correction to said data file thereby forming a first modified data file;

separating said first modified data file into a second modified data file and a third modified data file, wherein said second modified data file contains data relating to said dense line/space regions and said third modified data file contains data relating to said isolated line/space regions;

adding a critical dimension bias to said second modified data file thereby forming a fourth modified data file;

merging said third modified data file and said fourth modified data file into a fifth data file;

converting said fifth data file into a phase shifting mask data file;

forming a phase shifting mask using said phase shifting mask data file; and forming said circuit pattern on said wafer using said phase shifting mask.

9. The method of claim 8 wherein said phase shifting mask is an alternative phase shifting mask.

10. The method of claim 8 wherein the ratio of said first pitch to said first linewidth is about two.

11. The method of claim 8 wherein the ratio of said second pitch to said second linewidth is equal to or greater than about three.

12. The method of claim 8 wherein said first linewidth is between about 0.12 and 0.14 microns.

13. The method of claim 8 wherein said critical dimension bias is between about 0.04 and 0.08 microns.

14. The method of claim 8 wherein said wafer has a layer of insulating material formed thereon and said forming said circuit pattern on said wafer comprises irradiating said layer of insulating material through said phase shifting mask using light having a first wavelength.

15. The method of claim 14 wherein said first wavelength is 365 nanometers or 248 nanometers.

16. The method of claim 14 wherein said insulating material is photoresist.

17. The method of claim 8 wherein said wafer is an integrated circuit wafer.

* * * * *